US009503050B2

(12) United States Patent
Hamaoka et al.

(10) Patent No.: US 9,503,050 B2
(45) Date of Patent: Nov. 22, 2016

(54) ELASTIC WAVE DEVICES

(71) Applicant: SKYWORKS FILTER SOLUTIONS JAPAN CO., LTD., Kadoma-Shi (JP)

(72) Inventors: Yosuke Hamaoka, Osaka-Fu (JP); Mitsuhiro Furukawa, Hyogo-Ken (JP); Toru Yamaji, Kyoto-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 1 day.

(21) Appl. No.: 14/810,122

(22) Filed: Jul. 27, 2015

(65) Prior Publication Data

US 2016/0036414 A1 Feb. 4, 2016

Related U.S. Application Data

(63) Continuation of application No. PCT/JP2015/003372, filed on Jul. 3, 2015.

(51) Int. Cl.
*H03H 9/72* (2006.01)
*H03H 3/10* (2006.01)
*H03H 9/02* (2006.01)
*H03H 9/10* (2006.01)

(52) U.S. Cl.
CPC ............... *H03H 9/725* (2013.01); *H03H 3/10* (2013.01); *H03H 9/02984* (2013.01); *H03H 9/02992* (2013.01); *H03H 9/1064* (2013.01)

(58) Field of Classification Search
CPC ............. H03H 9/02992; H03H 9/725; H03H 9/02952; H03H 9/6483; H03H 3/10; H03H 9/02984; H03H 9/1064
USPC .......................................... 333/133, 193–196
See application file for complete search history.

(56) References Cited

U.S. PATENT DOCUMENTS

| 5,699,027 A | 12/1997 | Tsuji et al. |
| 7,940,146 B2 * | 5/2011 | Oda ......................... H03H 3/08 29/25.35 |
| 2004/0113215 A1 | 6/2004 | Shimada et al. |

(Continued)

FOREIGN PATENT DOCUMENTS

JP 2012109925 A 6/2012

OTHER PUBLICATIONS

International Search Report and Written Opinion from corresponding PCT Application Serial No. PCT/JP2015/003372 dated Sep. 10, 2015.

*Primary Examiner* — Benny Lee
*Assistant Examiner* — Jorge Salazar, Jr.
(74) *Attorney, Agent, or Firm* — Lando & Anastasi, LLP

(57) ABSTRACT

An elastic wave device that can be downsized. Certain examples of the elastic wave device include a substrate, an IDT electrode provided above the substrate, a wiring electrode provided above the substrate and connected to the IDT electrode, a sealing body sealing an excitation space in which the IDT electrode excites an elastic wave, and a sealing wall provided above the wiring electrode and forming a part of the sealing body. An outer periphery of the wiring electrode includes a protrusion. In one example, the wiring electrode includes a first wiring electrode provided on an upper surface of the substrate and a second wiring electrode provided on an upper surface of the first wiring electrode, an outer periphery of the second wiring electrode being provided with the protrusion.

20 Claims, 6 Drawing Sheets

(56) References Cited

U.S. PATENT DOCUMENTS

| | | |
|---|---|---|
| 2008/0266023 A1 | 10/2008 | Tanaka |
| 2009/0201102 A1 | 8/2009 | Oda |
| 2009/0302970 A1* | 12/2009 | Hatano ................ H03H 9/0571 333/133 |
| 2011/0012695 A1 | 1/2011 | Yamaji et al. |
| 2014/0132368 A1 | 5/2014 | Tsuda |

* cited by examiner

ELASTIC WAVE DEVICES

CROSS-REFERENCE TO RELATED APPLICATIONS

This application claims priority under 35 U.S.C. §119 and PCT Article 8 to co-pending Japanese Patent Application No. 2014-155795 filed on Jul. 31, 2014 and titled "ELASTIC WAVE DEVICES," which is herein incorporated by reference in its entirety for all purposes. This application further claims priority under 35 U.S.C. §120 to co-pending International Application No. PCT/JP2015/003372 filed on Jul. 3, 2015 and titled "ELASTIC WAVE DEVICES," which is herein incorporated by reference in its entirety for all purposes.

BACKGROUND

1. Field of Invention

Aspects and embodiments relate to an elastic wave device used in various electronic devices.

2. Discussion of Related Art

Conventionally, an elastic wave device has been well known as an electronic component used as a branching filter or a high frequency filter for wireless communication devices. Japanese Patent Application Publication No. 2012-109925 describes examples of a conventional elastic wave device.

SUMMARY OF INVENTION

Conventional elastic wave devices could be difficult to downsize because the excitation characteristic is affected by the excitation region of the interdigital transducer electrode (IDT electrode) being closer to a sealing member of the elastic wave device as a result of the downsizing.

Aspects and embodiments are directed to providing an elastic wave device that can be downsized relative to the size of conventional elastic wave devices having comparable features and/or performance.

According to certain embodiments, an elastic wave device includes a substrate, an IDT electrode provided above the substrate, a wiring electrode connected to the IDT electrode, an outer periphery of the wiring electrode being provided with a protrusion, a sealing body sealing an excitation space in which the IDT electrode excites an elastic wave, and a sealing wall provided above the wiring electrode and forming a part of the sealing body.

Providing the wiring electrode with a protrusion on the outer periphery enables the elastic wave device to be downsized without degrading the excitation characteristic because the protrusion prevents a member forming the sealing body and the sealing wall from entering the excitation region of the IDT electrode.

Various embodiments of the elastic wave device may include any one or more of the following features.

According to one embodiment and elastic wave device comprises a substrate, an IDT electrode disposed above the substrate, a sealing body sealing an excitation space in which the IDT electrode excites an elastic wave, a wiring electrode disposed above the substrate and connected to the IDT electrode, the wiring electrode including a protrusion formed on an outer periphery of the wiring electrode and configured to protrude into the excitation space, and a sealing wall disposed above the wiring electrode and forming a part of the sealing body, the sealing wall being spaced apart from the IDT electrode by the protrusion.

In one example the wiring electrode includes a first wiring electrode disposed on an upper surface of the substrate, and a second wiring electrode disposed on an upper surface of the first wiring electrode, the protrusion being formed on an outer periphery of the second wiring electrode.

In one example the elastic wave device further comprises a first dielectric film covering the IDT electrode, at least a portion of the second wiring electrode being disposed above the first dielectric film. In another example the elastic wave device further comprises a first dielectric film covering the IDT electrode, the second wiring electrode covering an outer periphery of the first dielectric film. In another example the elastic wave device further comprises a first dielectric film covering the IDT electrode and covering an outer periphery of the first wiring electrode. The elastic wave device may further comprise a second dielectric film covering the wiring electrode and the first dielectric film, the sealing wall being disposed above the second dielectric film. In another example the elastic wave device further comprises a first dielectric film covering the IDT electrode, the protrusion being disposed above an outer periphery of the first dielectric film.

In one example the elastic wave device further comprises a terminal electrode disposed on an upper surface of the sealing body, and a connection electrode connecting the wiring electrode to the terminal electrode.

According to another embodiment an elastic wave device comprises a piezoelectric substrate, an IDT electrode disposed on an upper surface of the piezoelectric substrate, a first wiring electrode disposed on the upper surface of the piezoelectric substrate and connected to the IDT electrode, a second wiring electrode, at least a portion of the second wiring electrode being disposed on an upper surface of the first wiring electrode, the second wiring electrode including a protrusion formed on an outer periphery of the second wiring electrode and configured to protrude into the excitation space, and a sealing body sealing an excitation space in which the IDT electrode excites an elastic wave, the sealing body including a sealing wall disposed above the second wiring electrode, the sealing wall being spaced apart from the IDT electrode by the protrusion.

In one example the elastic wave device further comprises a first dielectric film covering the IDT electrode. In another example the first dielectric film is disposed over an outer periphery of the first wiring electrode, and a portion of the second wiring electrode is disposed over an outer periphery of the first dielectric film. The elastic wave device may further comprise a second dielectric film covering the second wiring electrode and the first dielectric film, the sealing wall being disposed above the second dielectric film.

Additional aspects and embodiments are directed to providing an elastic wave filter and an antenna duplexer using such an elastic wave device, as well as a module and a communication device using the same.

In one embodiment an antenna duplexer comprises a transmission filter and a reception filter, at least one of the reception filter and the transmission filter including the elastic wave device according to any of the above-discussed embodiments, examples, or configurations.

Another embodiment is directed to a module comprising such an antenna duplexer.

According to another embodiment a module comprises an elastic wave filter that includes the elastic wave device of any of the above-discussed embodiments, examples, or configurations.

Another embodiment is directed to a communication device comprising the elastic wave device of the above-discussed embodiments, examples, or configurations.

According to another embodiment a method of manufacture of an elastic wave device comprises steps of providing a substrate, forming an IDT electrode on an upper surface of the substrate, forming a wiring electrode above the substrate and connected to the IDT electrode, the wiring electrode including a protrusion formed on an outer periphery of the wiring electrode and configured to protrude into an excitation space in which the IDT electrode excites an elastic wave, and forming a sealing body sealing the excitation space, the sealing body including a sealing wall disposed above the wiring electrode and spaced apart from the IDT electrode by the protrusion.

In one example forming the wiring electrode includes forming a first wiring electrode on the upper surface of the substrate, and forming a second wiring electrode on an upper surface of the first wiring electrode, including forming the protrusion on an outer periphery of the second wiring electrode.

In another example the method further comprises forming a first dielectric film covering the IDT electrode. In such examples, forming the second wiring electrode may include forming a portion of the second wiring electrode over an outer periphery of the first dielectric film. In one example forming the first dielectric film includes forming the first dielectric film covering an outer periphery of the first wiring electrode.

The method may further comprise forming a second dielectric film covering the second wiring electrode and the first dielectric film. In one example forming the sealing body includes forming the sealing wall over the second dielectric film.

In another example the method further comprises steps of forming a connection electrode extending through the sealing wall to the wiring electrode, forming a terminal electrode over the sealing wall, and connecting the terminal electrode to the wiring electrode via the connection electrode.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

As discussed above, aspects and embodiments are directed to an elastic wave device that has improved downsizing capability through the inclusion of a protrusion on the outer periphery of the wiring electrode that prevents the sealing body and/or sealing wall from intruding upon the excitation region of the IDT electrode and thereby prevents degradation of the excitation characteristic of a smaller (downsized) elastic wave device.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and the like are intended for convenience of description, not to limit the present systems and methods or their components to any one positional or spatial orientation. In particular, terms indicating directions such as "above," "below," "upper surface," "lower surface" and the like are used for designating relative directions depending only on a relative positional relationship between components included in the elastic wave device such as a substrate, an IDT electrode and the like, and therefore are not intended to designate absolute directions such as a vertical direction and the like.

Figure 1:
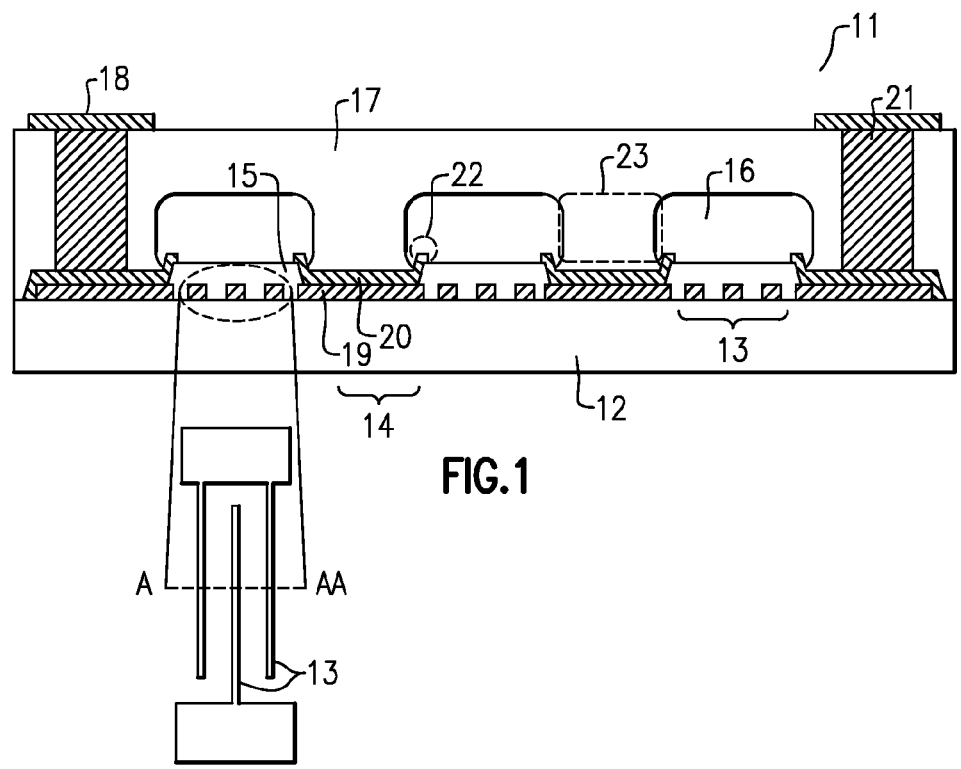
FIG. 1 is a diagram illustrating a cross-sectional view of one embodiment of an elastic wave device and corresponding top view of a portion of the elastic wave device, according to aspects of the present invention.

Referring to FIG. 1 there is illustrated an example of an elastic wave device according to one embodiment. FIG. 1 shows a cross-sectional view of an elastic wave device 11, along with a corresponding top view of a portion of the elastic wave device. The cross-sectional view taken along line A-AA corresponds to the region encircled by the dashed line. As shown in FIG. 1, the elastic wave device 11 includes a substrate 12, an interdigital transducer electrode (IDT electrode) 13 provided on an upper surface of the substrate 12, a wiring electrode 14 provided on an upper surface of the substrate 12, a first dielectric film 15 covering the IDT electrode 13, a sealing body 17 sealing an excitation space 16 in which the IDT electrode 13 excites an elastic wave, and a terminal electrode 18 provided on an upper surface of the sealing body 17.

In one example, the substrate 12 is preferably formed as a piezoelectric substrate, which may be made of a piezoelectric single crystal such as, for example, lithium tantalate, lithium niobate, quartz crystal, and the like.

The IDT electrode 13 is formed with opposing comb-shaped electrodes provided on an upper surface of the substrate 12 to form a resonator for exciting a specific elastic wave on the upper surface of the substrate 12 in response to an input of an electric signal. The IDT electrode 13 may be made of a single metal element, such as aluminum, copper, silver, gold, titanium, tungsten, molybdenum, platinum or chromium, for example, or an alloy composed mainly of one or more of these elements, or a layered structure thereof. A thickness of the IDT electrode 13 (when the IDT electrode 13 has a layered structure, the thickness is the total thickness of the structure) ranges from 0.2 to 0.6 µm, for example.

The wiring electrode 14 is a metal wiring provided on an upper surface of the substrate 12 and is connected to the IDT electrode 13 to form a circuit of the elastic wave device 11.

In certain examples the wiring electrode 14 includes a first wiring electrode 19 provided on an upper surface of the substrate 12 and a second wiring electrode 20 provided above the first wiring electrode 19. The first wiring electrode 19 may have the same configuration as the IDT electrode 13 in terms of the material and/or the layered structure.

The first dielectric film 15 covers an outer periphery of the first wiring electrode 19. The first dielectric film 15 covering the outer periphery of the first wiring electrode 19 protects the IDT electrode 13 and the first wiring electrode 19 from corrosion and mechanical stresses.

The second wiring electrode 20 is formed above the first wiring electrode 19 and a part thereof is formed above the first dielectric film 15. The part of the second wiring electrode 20 may be formed above the region of the first wiring electrode 19 that is covered with the first dielectric film 15 so that this part of the second wiring electrode 20 can form a wiring crossed with the first wiring electrode 19 at a different grade (different height above the surface of the substrate 12). This may improve flexibility in design of the wirings.

An outer periphery of the second wiring electrode 20 is formed above the first dielectric film 15, and a protrusion 22 is formed on the outer periphery of the second wiring electrode 20. The protrusion 22 may be formed in a process of forming the second wiring electrode 20 above the outer periphery of the first dielectric film 15 to allow the second wiring electrode 20 to overlap the first dielectric film 15 without requiring any other processes.

Configuring the wiring electrode 14 to be a layered structure of the first wiring electrode 19 and the second wiring electrode 20 may increase the thickness of the wiring electrode 14. As a result, the resistance of the wiring electrode 14 can be lowered to reduce the loss of the elastic wave device 11. The increased thickness can also effectively dissipate heat generated from the IDT electrode 13.

In one example, the first dielectric film 15 is an insulation film for covering an upper surface of the substrate 12 and is an inorganic insulation film mainly composed of, for example, silicon oxide ($SiO_2$), to protect the IDT electrode 13 from chemical degradation and mechanical damage. The first dielectric film 15 may be formed with a composition having a temperature coefficient of frequency of which the sign is opposite to the temperature coefficient of frequency of the substrate 12, so that fluctuations in the frequency characteristic of the elastic wave device 11 due to temperature changes can be suppressed. Covering the outer periphery of the first dielectric film 15 with the second wiring electrode 20 prevents moisture ingress between the first dielectric film 15 and the substrate 12, and also protects the outer periphery of first dielectric film 15 from applied stresses.

Still referring to FIG. 1, the sealing body 17 seals an excitation space 16 for the IDT electrode 13 to excite an elastic surface wave in a surface of the substrate 12. The sealing body 17 may be formed, for example, with light-curing polyimide resin or light-curing epoxy resin, and may include a reinforcing member (of metal or the like) therewithin. The sealing body 17 includes a sealing wall 23 that supports the excitation space 16 from the side surface and seals the excitation space 16. The sealing wall 23 may be provided above the second wiring electrode 20, and is separated from the excitation region of the IDT electrode 13 by the protrusion 22. In certain examples, the sealing wall 23 is formed of the same material as the sealing body 17.

As discussed above, the wiring electrode 14 including the protrusion 22 may prevent a sealing member forming the sealing body 17 from entering the excitation region of the IDT electrode 13 so that degradation of the excitation characteristic of the elastic wave device 11 can be prevented. In particular, the sealing wall 23 is spaced apart from the IDT electrode 13 by the protrusion 22 so that the sealing body 17 is prevented from entering the excitation region of the IDT electrode 13 and the reliability of the elastic wave device 11 is improved.

In one example, the terminal electrode 18 is an electrode made of metal and provided on an upper surface of the sealing body 17. The terminal electrode 18 is connected to the wiring electrode 14 on the substrate 12 via a columnar connection electrode 21, and may operate as an input/output terminal or a ground terminal of the elastic wave device 11 for interfacing with an external circuit (not shown). Providing the terminal electrode 18 on the upper surface of the sealing body 17 and connecting the wiring electrode 14 to the terminal electrode 18 by the connection electrode 21 may further contribute to allowing the size of the elastic wave device 11 to be reduced.

Thus, in summary and as discussed above, the elastic wave device 11 includes the substrate 12, the IDT electrode 13 provided above the substrate 12, the wiring electrode 14 provided above the substrate 12 and connected to the IDT electrode 13, the wiring electrode 14 including a protrusion 22 on the outer periphery, the sealing body 17 sealing the excitation space 16 in which the IDT electrode 13 excites an elastic wave, and the sealing wall 23 provided above the wiring electrode 14 and forming a part of the sealing body 17. Accordingly, a sealing member forming the sealing body 17 can be prevented from entering the excitation region of the IDT electrode 13 so that the elastic wave device 11 can be downsized without degrading the excitation characteristic.

Further, in certain examples of the elastic wave device 11, the wiring electrode 14 is configured to include a first wiring electrode 19 provided on an upper surface of the substrate 12 and a second wiring electrode 20 provided on an upper surface of the first wiring electrode 19, the second wiring electrode 20 being provided with the protrusion 22 on the outer periphery. Accordingly, a thickness of the wiring electrode 14 connected to the IDT electrode 13 may be increased for lowering a resistance of the wiring electrode 14 to reduce the loss of the elastic wave device 11 and also for effectively dissipating heat generated from the IDT electrode 13 so that the reliability of the elastic wave device 11 can be improved. Further, a wiring pattern of the first wiring electrode 19 can be designed independently from that of the second wiring electrode 20 and therefore it is possible to arrange the protrusion 22 according to the positioning of the sealing wall 23.

In addition, the elastic wave device 11 includes the first dielectric film 15 that covers the IDT electrode 13 and also covers an outer periphery of the first wiring electrode 19. Accordingly, the IDT electrode 13 and the wiring electrode 14 can be more effectively protected from corrosion and mechanical stresses so that the reliability of the elastic wave device 11 can be improved.

Further, in the elastic wave device 11, a portion of the second wiring electrode 20 may be provided above the first dielectric film 15 so that the wirings can be arranged crossed with each other at a different grade between the portion of the second wiring electrode 20 and the first wiring electrode 19 passing below the first dielectric film 15 to easily improve the design flexibility. Additionally, an outer periphery of the first dielectric film 15 may be covered with the second wiring electrode 20 so that the first dielectric film 15 is more effectively protected from moisture and stresses, thereby improving the reliability of the elastic wave device 11.

As discussed above, in certain examples of the elastic wave device 11, the protrusion 22 is provided above the outer periphery of the first dielectric film 15 so that the protrusion 22 may be formed without any additional process. In particular, forming the second wiring electrode 20 above the outer periphery of the first dielectric film 15 can realize an overlapped structure in thickness between the first dielectric film 15 and the second wiring electrode 20.

Figure 2:
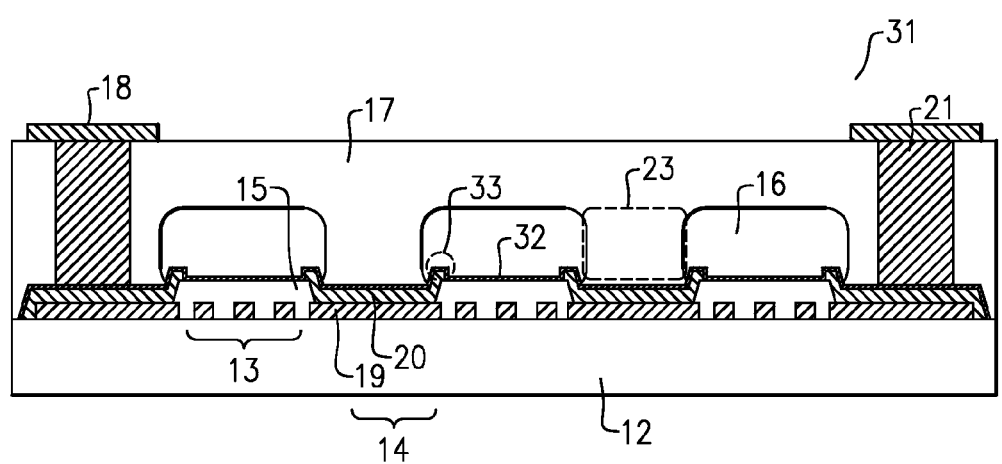
FIG. 2 is a cross-sectional view of another embodiment of an elastic wave device according to aspects of the present invention.

Referring to FIG. 2 there is illustrated, in cross-section, another embodiment of an elastic wave device 31 according to aspects of the present invention. Components of elastic wave device 31 shown in FIG. 2 that are in common with those of elastic wave device 11 of the embodiment shown in FIG. 1 are designated by like reference numerals and are not further described. The elastic wave device 31 as shown in FIG. 2 differs from the elastic wave device 11 as shown in FIG. 1 in that there is a second dielectric film 32 covering the first dielectric film 15 and the second wiring electrode 20.

Similar to the elastic wave device 11, the elastic wave device 31 may prevent a sealing member forming the sealing body 17 from entering the excitation region of the IDT electrode 13 through the inclusion of a protrusion 33 formed on an outer periphery of the wiring electrode 14. As discussed above, this prevents degradation of the excitation characteristic of the elastic wave device 31, and therefore it is possible to downsize the elastic wave device.

The elastic wave device 31 further includes a second dielectric film 32 covering the first dielectric film 15 and the second wiring electrode 20. The sealing wall 23 is disposed on the second dielectric film 32, as shown in FIG. 2. Providing the second dielectric film 23 so located may assist in more effectively preventing corrosion of the IDT electrode 13. Further, corrosion of the second wiring electrode 20 can be prevented by covering a portion of the second wiring electrode exposed to the excitation space 16 with the second dielectric film 32. As a result, the reliability of the elastic wave device 31 may be further improved.

Figure 3:
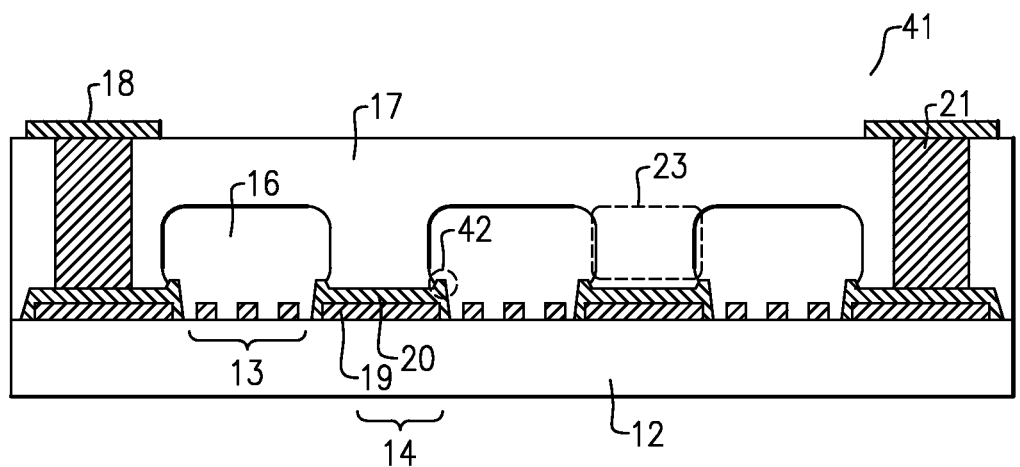
FIG. 3 is a cross-sectional view of another embodiment of an elastic wave device according to aspects of the present invention.

FIG. 3 illustrates a cross-sectional view of an elastic wave device 41 according to another embodiment. Components of elastic wave device 41 shown in FIG. 4 that are in common with those of the elastic wave device 11 of the embodiment shown in FIG. 1 and/or the elastic wave device 31 of the embodiment shown in FIG. 2 are designated by like reference numerals and are not further described. The elastic wave device 41 as shown in FIG. 3 differs from the elastic wave device 11 as shown in FIG. 1 and the elastic wave device 31 as shown in FIG. 2 in that the first dielectric film 15 and the second dielectric film 32 are eliminated.

Even though the first dielectric film 15 and the second dielectric film 32 are not present in the elastic wave device 41, the wiring electrode 14 is provided with a protrusion 42 to prevent a sealing member forming the sealing body 17 from entering the excitation region of the IDT electrode 13 so that the elastic wave device 41 can be downsized without degrading the excitation characteristic, as discussed above.

Embodiments and examples of the elastic wave devices disclosed herein may be useful as an electronic component used in various electronic devices, such as a wireless communication device, for example.

Figure 4A:
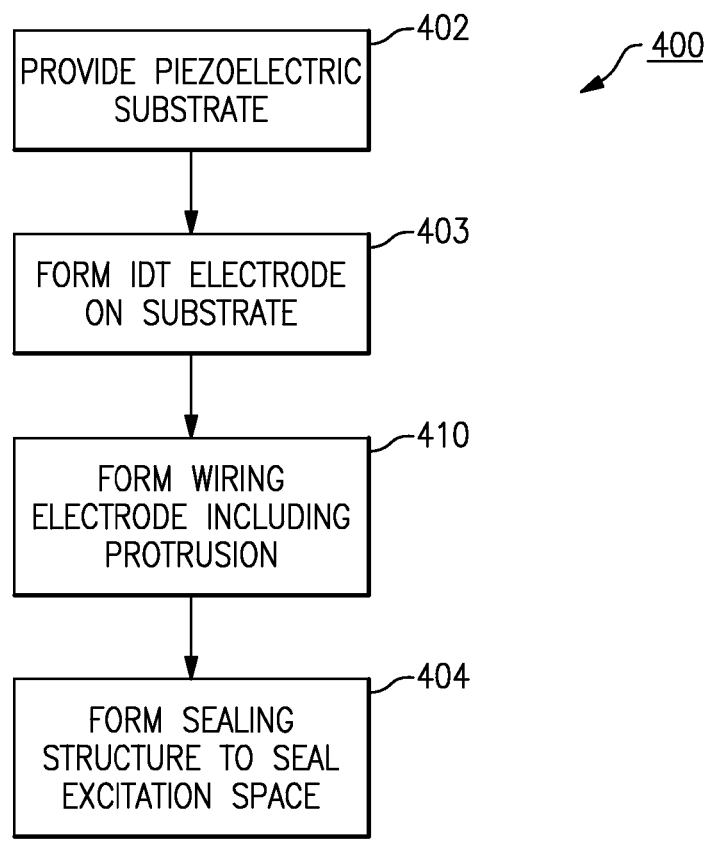
FIG. 4A is a flow diagram of one example of a method of manufacture of an elastic wave device, according to aspects of the present invention.
Figure 4B:
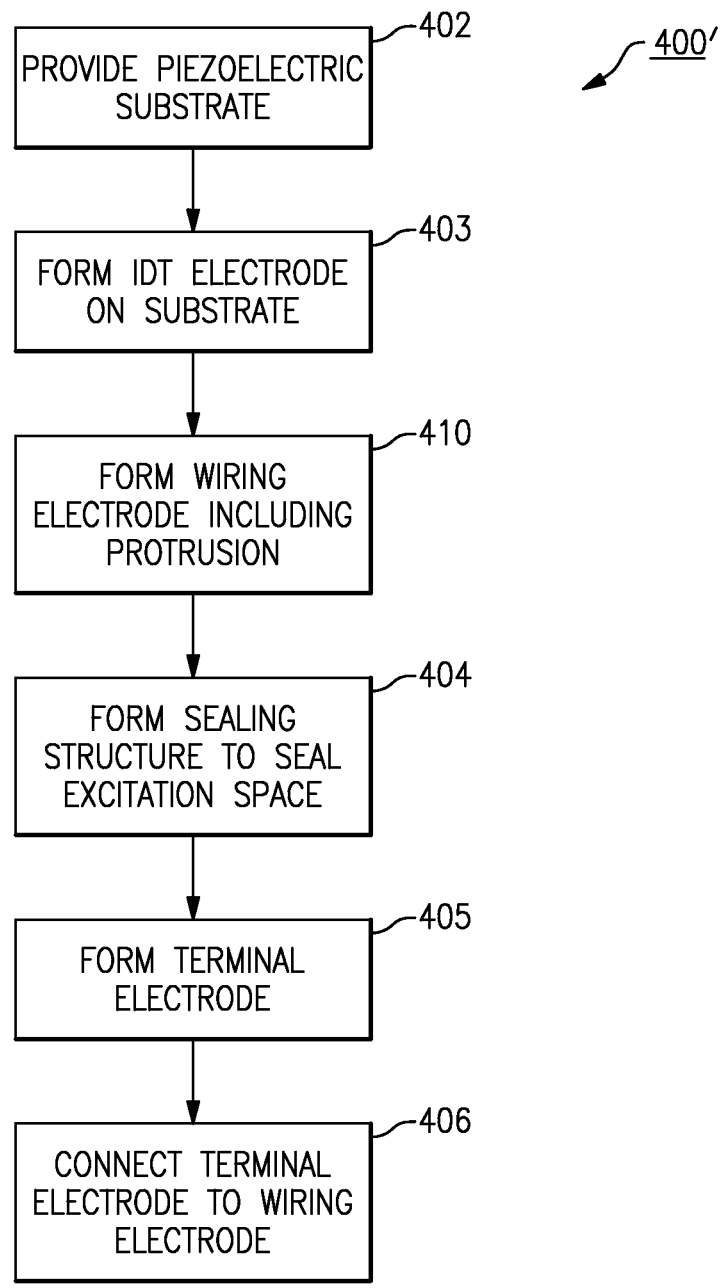
FIG. 4B is a flow diagram of another example of a method of manufacture of an elastic wave device, according to aspects of the present invention.

Referring to FIG. 4A, there is illustrated a flow diagram of one example of a method of manufacture 400 of an elastic wave device according to certain aspects and embodiments. A first step 402 includes providing a piezoelectric substrate 12. As discussed above, the piezoelectric substrate may be made of a piezoelectric single crystal such as, for example, lithium tantalate, lithium niobate, quartz crystal, and the like. Step 403 includes forming an IDT electrode 13 on the piezoelectric substrate 12. As discussed above, the IDT electrode 13 may be made of a single metal element, such as aluminum, copper, silver, gold, titanium, tungsten, molybdenum, platinum or chromium, for example, or an alloy composed mainly of one or more of the aforementioned elements, or a layered structure thereof. Accordingly, step 403 of forming the IDT electrode 13 may include using any of a variety of known metal deposition techniques, such as, for example, sputtering, electrolytic plating, etc., optionally with the aid of photolithography techniques to shape the IDT electrode as desired.

Step 410 includes forming a wiring electrode 14 on the upper surface of the piezoelectric substrate 12 and connecting the wiring electrode to the IDT electrode. As discussed above, in certain examples, the wiring electrode 14 may have the same or a similar configuration to the IDT electrode 13, and therefore can be similarly formed using known metal deposition and photolithography techniques, for example. Where the wiring electrode 14 includes a first wiring electrode 19 and a second wiring electrode 20 formed above the first wiring electrode, the first wiring electrode 19 and the IDT electrode 13 may be formed in the same step. Step 410 includes forming the protrusion 22 on an outer periphery of the wiring electrode 14, the protrusion extending into an excitation space 16 above the IDT electrode 13, as discussed above.

Step 404 includes forming a sealing structure to seal the excitation space 16. Forming the sealing structure includes forming the sealing body 17 and the sealing wall 23 to support and seal the excitation space 16. As discussed above, the protrusion 22 prevents the sealing structure from intruding into the excitation space 16. In certain examples, step 404 includes forming the sealing body 17 and sealing wall 23 of a light-curing or photosensitive resin, such as a light-curing polyimide resin or light-curing epoxy resin, for example. Accordingly, step 404 may include performing a patterning method with the aid of well-known photolithographic techniques. More specifically, step 404 may include applying a composition of the photosensitive resin on the upper surface of the substrate 12 and/or wiring electrode 14, and then patterning the composition using steps of light exposure, development, and curing.

As discussed above, and referring to FIG. 4B, in certain examples, the method 400' further includes a step 405 forming a terminal electrode 18 on an upper surface of the sealing body 17. In one example, the terminal electrode 18 is made of metal, and accordingly, step 405 may including forming the terminal electrode using any of a variety of well-known metal deposition techniques, including, but not limited to, sputtering, electrolytic plating, and the like.

In certain examples, the terminal electrode 18 is connected to the wiring electrode 14 via a columnar connection electrode 21. Accordingly, the method 400' may include a step 406 of connecting the terminal electrode 18 to the wiring electrode 14. Step 406 may include, prior to step 405, forming an opening, for example, by etching, in the sealing body 17 to expose a portion of the wiring electrode 14. In one example, steps 405 and 406 include forming the columnar connection electrode 21 in the opening and connecting the terminal electrode 18 to the columnar connection electrode 21. Optionally, forming the columnar connection electrode 21 in the opening may be performed as part of the process of forming the terminal electrode 18. Alternatively, the columnar connection electrode 21 may be formed prior to formation of the terminal electrode 18.

Figure 5:
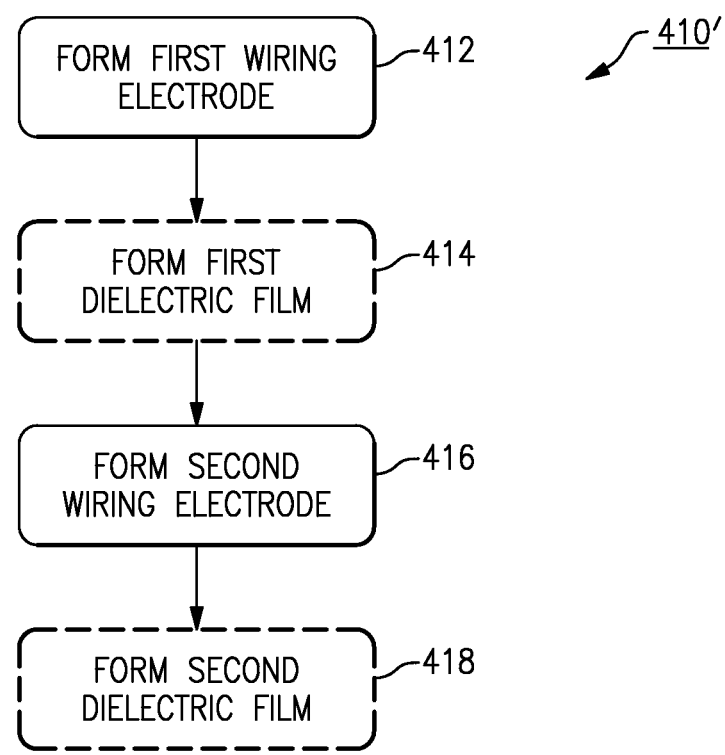
FIG. 5 is a flow diagram of a portion of a method of manufacture of an elastic wave device, which may be part of the methods of FIG. 4A or 4B, according to aspects of the present invention.

As also discussed above, in certain embodiments, the wiring electrode 14 includes a first wiring electrode 19 and a second wiring electrode 20. Accordingly, in some examples of the method, the step 410 of forming the wiring electrode may be replaced or supplemented with the process illustrated in FIG. 5. FIG. 5 is a flow diagram illustrating one example of a portion 410' of a method of manufacture of an elastic wave device, which may be included in the method of FIGS. 4A and/or 4B at step 410.

Referring to FIG. 5, step 412 includes forming the first wiring electrode 19 on the upper surface of the substrate 12. As discussed above, the first wiring electrode 19 may be formed in the same step as the IDT electrode 13. Step 416 includes forming the second wiring electrode 20 above the first wiring electrode 19. As discussed above, in certain embodiments, for example, as shown in FIG. 3, step 416 includes forming the second wiring electrode 20 on the first wiring electrode 19. However, in other examples, at least a portion of the second wiring 20 is separated from the first wiring electrode 19 by a dielectric film. Accordingly, the method 410' may optionally include a step 414 of forming a first dielectric film 15 covering an outer periphery of the first wiring electrode 19, as shown, for example, in FIGS. 1 and 2. In certain examples, the dielectric film 15 is an insulating film, such an $SiO_2$ film, for example, and step 414 may include using any of a variety of well-known deposition, and optionally patterning, techniques. Step 416 of forming the second wiring electrode may include forming a part of the second wiring electrode 20 above the outer periphery of the first dielectric film, such that the first dielectric film is positioned between portions of the first and second wiring electrode, as shown, for example, in FIGS. 1 and 2.

The methods 400, 400' and/or 410 may further optionally include a step 418 of forming a second dielectric film 32 covering the first dielectric film 15 and the second wiring electrode 20, as shown, for example, in FIG. 2. In this example, step 404 of forming the sealing structure may include forming the sealing wall 23 on the second dielectric film 32.

As discussed above, aspects and embodiments may realize an elastic wave device having improved reliability and/or performance, and which can be downsized without degrading the excitation characteristic. It will be appreciated by those skilled in the art, given the benefit of this disclosure, that configuring components or devices, such as an elastic wave filter, an antenna duplexer, a module, or a communications device, for example, to use embodiments of the elastic wave device according to this disclosure can realize such components or devices having enhanced or improved features through the benefits provided by the elastic wave device.

Figure 6:
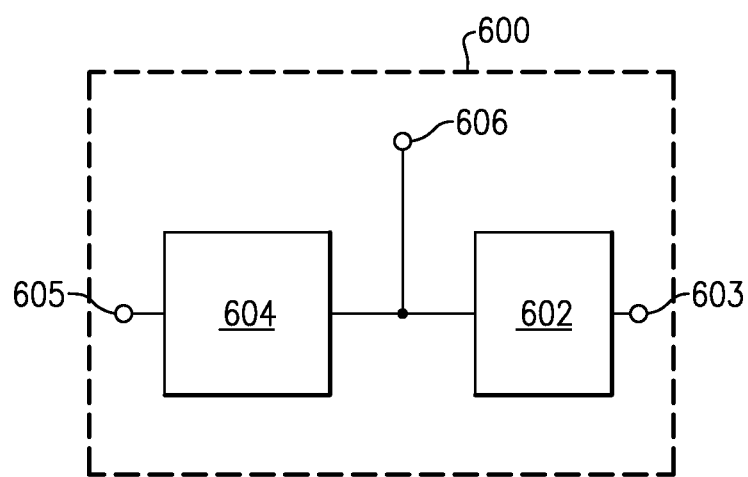
FIG. 6 is a block diagram of one example of an antenna duplexer incorporating an elastic wave device according to aspects of the present invention.

According to one embodiment, the elastic wave device may be used to provide an antenna duplexer having improved characteristics. FIG. 6 illustrates a block diagram of one example of an antenna duplexer which can incorporate embodiments of the elastic wave devices disclosed herein. The antenna duplexer 600 includes a transmission filter 602 and a reception filter 604 that are connected to a shared antenna terminal 606. The transmission filter 602 includes a transmission-side terminal 603 for connecting the transmission filter to transmitter circuitry (not shown), and the reception filter includes a receive-side terminal 605 for connecting the reception filter to receiver circuitry (not shown). Either or both of the transmission filter 602 and the reception filter 604 can include one or more of the elastic wave devices 11, 31, and/or 41. By configuring the antenna duplexer 600 to use the elastic wave devices 11, 31, and/or 41, an antenna duplexer having improved characteristics and enhanced performance (resulting from the improved characteristics of the elastic wave device discussed above) can be realized.

Figure 7:
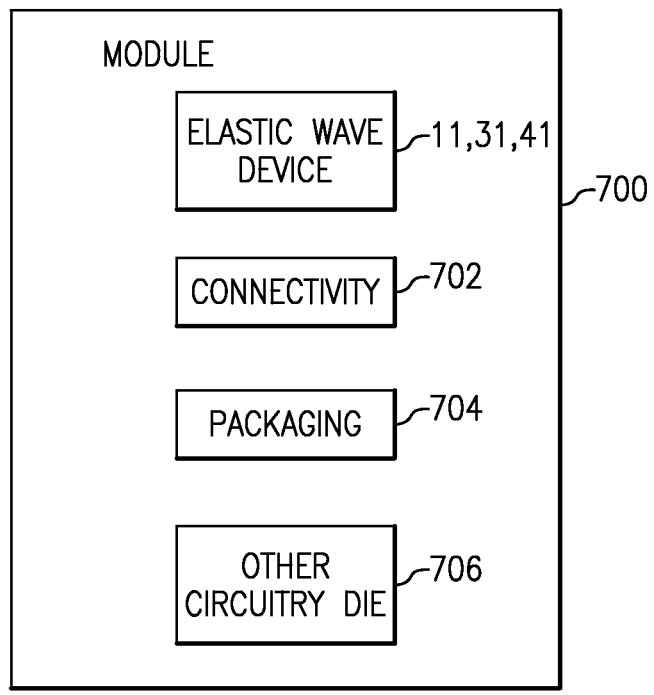
FIG. 7 is a block diagram of one example of a module incorporating an elastic wave device according to aspects of the present invention.

Further, embodiments of the elastic wave devices 11, 31, 41 may be incorporated, optionally as part of the antenna duplexer 600, into a module that may ultimately be used in a device, such as a wireless communications device, for example, so as to provide a module having enhanced performance. FIG. 7 is a block diagram illustrating one example of a module 700 including the elastic wave device 11, 31, and/or 41. The module 700 further includes connectivity 702 to provide signal interconnections, packaging 704, such as for example, a package substrate, for packaging of the circuitry, and other circuitry die 706, such as, for example amplifiers, pre-filters, modulators, demodulators, down converters, and the like, as would be known to one of skill in the art of semiconductor fabrication in view of the disclosure herein. In certain embodiments, the elastic wave device 11, 31, or 41 in module 700 may be replaced with the antenna duplexer 600, so as to provide an RF module, for example.

Figure 8:
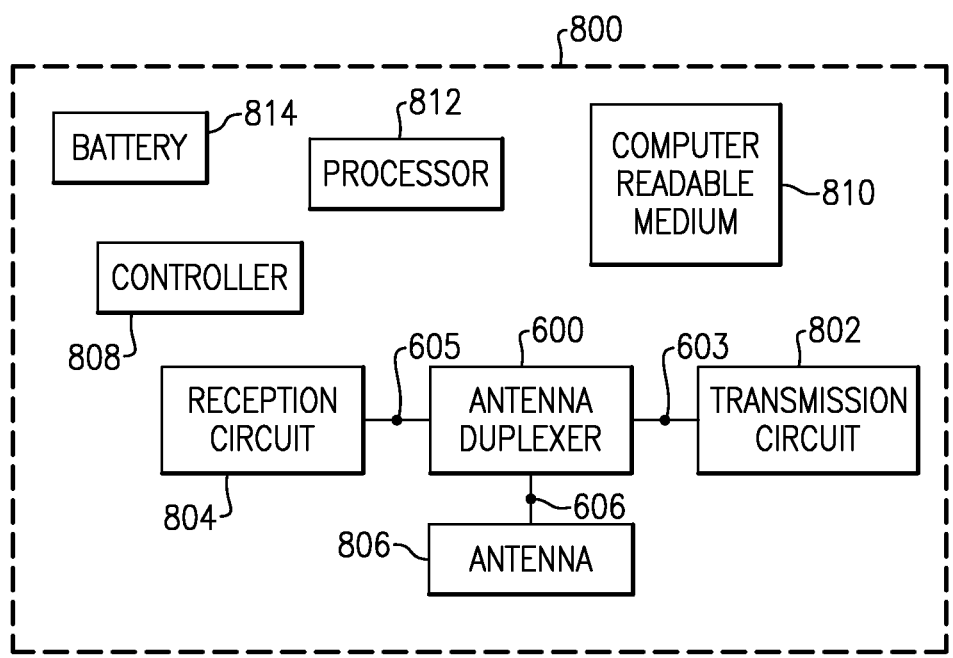
FIG. 8 is a block diagram of one example of a communications device incorporating the antenna duplexer of FIG. 6, according aspects of the present invention.

Furthermore, configuring an elastic wave filter and an/or antenna duplexer to use embodiments of the elastic wave device 11, 31, and/or 41 can achieve the effect of realizing a communication device having enhanced performance using the same. FIG. 8 is a schematic block diagram of one example of a communication device 800 (e.g., a wireless or mobile device) that can include the antenna duplexer 600 incorporating one or more elastic wave devices 11, 31, and/or 41, as discussed above. The communication device 800 can represent a multi-band and/or multi-mode device such as a multi-band/multi-mode mobile phone, for example. In certain embodiments, the communication device 800 can include the antenna duplexer 600, a transmission circuit 802 connected to the antenna duplexer via the transmission-side terminal 603, a reception circuit 804 connected to the antenna duplexer 600 via the receive-side terminal 605, and an antenna 806 connected to the antenna duplexer via the antenna terminal 606. The transmission circuit 802 and reception circuit 804 may be part of a transceiver that can generate RF signals for transmission via the antenna 806 and can receive incoming RF signals from the antenna 806. The communication device 800 can further include a controller 808, a computer readable medium 810, a processor 812, and a battery 814.

It will be understood that various functionalities associated with the transmission and receiving of RF signals can be achieved by one or more components that are represented in FIG. 8 as the transmission circuit 802 and the reception circuit 804. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 8 as the antenna 806. For example, a single antenna can be configured to provide both transmitting and receiving functionalities. In another example, transmitting and receiving functionalities can be provided by separate antennas. In yet another example in which the communication device is a multi-band device, different bands associated with the communication device 800 can be provided with different antennas.

To facilitate switching between receive and transmit paths, the antenna duplexer 600 can be configured to electrically connect the antenna 806 to a selected transmit or receive path. Thus, the antenna duplexer 600 can provide a number of switching functionalities associated with an operation of the communication device 800. In addition, as discussed above, the antenna duplexer 600 includes the transmission filter 602 and reception filter 604, which are configured to provide filtering of the RF signals. As discussed above, either or both of the transmission filter 602 and reception filter 604 can include embodiments of the elastic wave devices 11, 31, and/or 41, and thereby provide enhanced features and/or performance through the benefits of the ability to downsize and improved connection reliability achieved using embodiments of the elastic wave devices 11, 31, and/or 41. In certain examples, the antenna duplexer 600 in the communication device 800 can be replaced with a module 700, which includes the antenna duplexer, as discussed above.

As shown in FIG. 8, in certain embodiments, a controller 808 can be provided for controlling various functionalities associated with operations of the antenna duplexer 600 and/or other operating component(s). In certain embodiments, a processor 812 can be configured to facilitate implementation of various processes for operation of the communication device 800. The processes performed by the processor 812 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 800. In certain embodiments, these computer program instructions may also be stored in the computer-readable medium 810. The battery 814 can be any suitable battery for use in the communication device 800, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An elastic wave device comprising:
   a piezoelectric substrate;
   an interdigital transducer (IDT) electrode disposed on the piezoelectric substrate;
   a dielectric sealing body sealing an excitation space in which the IDT electrode excites an elastic wave;
   a wiring electrode connected to the IDT electrode, the wiring electrode including a first wiring electrode disposed directly on and contacting an upper surface of the piezoelectric substrate, and a second wiring electrode disposed directly on and contacting an upper of the first wiring electrode, the second wiring electrode including a protrusion formed on an outer periphery of the second wiring electrode and configured to protrude beyond an outer periphery of the first wiring electrode into the excitation space; and
   a sealing wall extending vertically between the dielectric sealing body and the second wiring electrode and being continuous with and forming a part of the dielectric sealing body, the sealing wall being spaced apart from the IDT electrode by the protrusion and having a side surface defining a side edge of the excitation space.

2. The elastic wave device of claim 1 further comprising a first dielectric film covering the IDT electrode, at least a portion of the second wiring electrode being disposed on the first dielectric film.

3. The elastic wave device of claim 2 wherein the portion of the second wiring electrode that is disposed above the first dielectric film includes the protrusion.

4. The elastic wave device of claim 1 further comprising a first dielectric film covering the IDT electrode, the second wiring electrode covering an outer periphery of the first dielectric film.

5. The elastic wave device of claim 1 further comprising a first dielectric film covering the IDT electrode and covering the outer periphery of the first wiring electrode.

6. The elastic wave device of claim 5 further comprising a second dielectric film covering the second wiring electrode and the first dielectric film, the sealing wall being disposed on the second dielectric film.

7. The elastic wave device of claim 1 further comprising a first dielectric film covering the IDT electrode, the protrusion being disposed above an outer periphery of the first dielectric film.

8. The elastic wave device of claim 1 further comprising:
a terminal electrode disposed on an upper surface of the dielectric sealing body; and
a connection electrode connecting the wiring electrode to the terminal electrode.

9. An antenna duplexer comprising:
a transmission filter; and
a reception filter, at least one of the reception filter and the transmission filter including the elastic wave device of claim 1.

10. A module comprising the antenna duplexer of claim 9.

11. A module comprising an elastic wave filter that includes the elastic wave device of claim 1.

12. A communication device comprising the elastic wave device of claim 1.

13. A method of manufacture of an elastic wave device, the method comprising:
providing a peizoelectric substrate;
forming an interdigital transducer (IDT) electrode on a first surface of the piezoelectric substrate;
forming a wiring electrode on the piezoelectric substrate and connected to the IDT electrode, including forming a first wiring electrode on the first surface of the piezoelectric substrate during the step of forming the IDT electrode, and forming a second wiring electrode on a surface of the first wiring electrode, the second wiring electrode including a protrusion formed on an outer periphery of the second wiring electrode and configured to protrude beyond the first wiring electrode into an excitation space in which the IDT electrode excites an elastic wave; and
forming a dielectric sealing body sealing the excitation space, the dielectric sealing body including a sealing wall disposed on the second wiring electrode and spaced apart from the IDT electrode by the protrusion, the sealing wall having a side surface defining an edge of the excitation space.

14. The method of claim 13 further comprising:
forming a connection electrode extending through the sealing wall to the second wiring electrode;
forming a terminal electrode over the sealing wall; and
connecting the terminal electrode to the second wiring electrode via the connection electrode.

15. The method of claim 13 further comprising forming a first dielectric film covering the IDT electrode.

16. The method of claim 15 wherein forming the second wiring electrode includes forming a portion of the second wiring electrode, including the protrusion, over an outer periphery of the first dielectric film.

17. The method of claim 16 wherein forming the first dielectric film includes forming the first dielectric film covering an outer periphery of the first wiring electrode.

18. The method of claim 17 further comprising forming a second dielectric film covering the second wiring electrode and the first dielectric film.

19. The method of claim 18 wherein forming the dielectric sealing body includes forming the sealing wall over the second dielectric film.

20. An elastic wave device comprising:
a piezoelectric substrate;
an interdigital transducer (IDT) electrode disposed on a first surface of the piezoelectric substrate;
a first wiring electrode disposed on the first surface of the piezoelectric substrate adjacent the IDT electrode;
a first dielectric film covering the IDT electrode and an outer periphery of the first wiring electrode;
a second wiring electrode disposed on a surface of the first wiring electrode and including a protrusion that extends over an outer periphery of the first dielectric film into an excitation space above the IDT electrode in which the IDT electrode excites an elastic wave, at least one of the first and second wiring electrodes being electrically connected to the IDT electrode;
a dielectric sealing structure that extends over and seals the excitation space in which the IDT electrode excites the elastic wave, the dielectric sealing structure including a sealing wall disposed on and contacting the second wiring electrode, the sealing wall being spaced apart from the IDT electrode by the protrusion and having a side surface that defines a side edge of the excitation space;
a terminal electrode disposed on an upper surface of the sealing structure; and
a connection electrode extending through the sealing structure and electrically connecting the terminal electrode to the second wiring electrode.

* * * * *